(12) United States Patent
Uchida et al.

(10) Patent No.: US 8,604,571 B2
(45) Date of Patent: Dec. 10, 2013

(54) THERMOELECTRIC CONVERSION DEVICE (75) Inventors: Kenichi Uchida, Miyagi (JP); Yosuke Kajiwara, Miyagi (JP); Hiroyasu Nakayama, Miyagi (JP); Eiji Saitoh, Kanagawa (JP)

(73) Assignee: Tohoku University, Sendai-shi, Miyagi (JP)

( * ) Notice: Subject to any disclaimer, the term of this patent is extended or adjusted under 35 U.S.C. 154(b) by 58 days.

(21) Appl. No.: 12/997,461

(22) PCT Filed: Jun. 5, 2009

(86) PCT No.: PCT/JP2009/060317
§ 371 (c)(1),
(2), (4) Date: Dec. 10, 2010

(87) PCT Pub. No.: WO2009/151000
PCT Pub. Date: Dec. 17, 2009

(65) Prior Publication Data
US 2011/0084349 A1    Apr. 14, 2011

(30) Foreign Application Priority Data
Jun. 12, 2008  (JP) ................................ 2008-153781

(51) Int. Cl.
*H01L 29/82*   (2006.01)
*G11C 11/18*   (2006.01)

(52) U.S. Cl.
USPC .................... 257/421; 365/170; 257/E29.323

(58) Field of Classification Search
USPC ........... 257/930, E23.082, E23.083, E43.003, 257/E43.004, E43.006, E43.007, 421, 257/E29.323; 365/170
See application file for complete search history.

(56) References Cited

U.S. PATENT DOCUMENTS

| | | | | |
|---|---|---|---|---|
| 7,807,917 B2* | 10/2010 | Atanackovic | ............... | 136/236.1 |
| 8,203,191 B2* | 6/2012 | Uchida et al. | ................. | 257/421 |
| 2003/0189234 A1* | 10/2003 | Johnson et al. | ............... | 257/421 |
| 2003/0197235 A1* | 10/2003 | Johnson et al. | ............... | 257/428 |
| 2003/0234429 A1* | 12/2003 | Johnson et al. | ............... | 257/421 |
| 2004/0232893 A1* | 11/2004 | Odagawa et al. | ............. | 320/154 |

(Continued)

FOREIGN PATENT DOCUMENTS

| | | | | |
|---|---|---|---|---|
| JP | 09107129 | * | 4/1997 | ............. H01L 35/32 |
| JP | 2007-165463 A | | 6/2007 | |
| WO | 2009/066631 A1 | | 5/2009 | |
| WO | WO 2009/066631 | * | 5/2009 | ............. H01L 29/82 |

OTHER PUBLICATIONS

WO 2009/066631 (US Patent 8,203191 used as English translation).*

(Continued)

*Primary Examiner* — Daniel Luke
*Assistant Examiner* — Latanya N. Crawford
(74) *Attorney, Agent, or Firm* — Westerman, Hattori, Daniels & Adrian, LLP (57) ABSTRACT

The thermoelectric conversion efficiency of a thermoelectric conversion device is increased by increasing the figure of merit of a spin-Seebeck effect element. An inverse spin-Hall effect material is provided to at least one end of a thermal spin-wave spin current generating material made of a magnetic dielectric material so that a thermal spin-wave spin current is converted to generate a voltage in the above described inverse spin-Hall effect material when there is a temperature gradient in the above described thermal spin-wave spin current generating material and a magnetic field is applied using a magnetic field applying means.

8 Claims, 11 Drawing Sheets

(56) References Cited

U.S. PATENT DOCUMENTS

2004/0239936 A1* 12/2004 Kochergin .................. 356/445
2006/0021646 A1* 2/2006 Yotsuhashi et al. ........ 136/236.1
2006/0255310 A1* 11/2006 Funahashi ................. 252/62.3 T
2007/0069192 A1* 3/2007 Odagawa et al. ................ 257/2

OTHER PUBLICATIONS

Saitoh, E et al. "Conversion of spin current into charge current at room temperature: Inverse spin-Hall effect," Applied Physics Letters, May 5, 2006, vol. 88, p. 182509.

Uchida, K. et al. "Observation of the spin Seebeck effect," Nature, Oct. 9, 2008, vol. 455, pp. 778-781.

Uchida, Ken'Ihi et al. "Spin-ryu Seisei Kenshutsu Gijutsu no Saizensen—Spin-Hall Koka no Oyo to Spin-Seebeck Koka no Kansoku-" Solid State Physics, May 15, 2009, vol. 519 (vol. 44, No. 5), pp. 281-291.

Silsbee, R. H. et al. "Coupling between ferromagnetic and conduction-spin-resonance modes at a ferromagnetic-normal-metal interface," Physical Review B, May 1, 1979, vol. 19, No. 9, pp. 4382-4399.

* cited by examiner

THERMOELECTRIC CONVERSION DEVICE

TECHNICAL FIELD

The present invention relates to a thermoelectric conversion device, and in particular to a thermoelectric conversion device characterized by having a material for generating a spin current using heat.

BACKGROUND ART

In recent years there has been a greater need for clean energy as a measure against global warming, and use of thermoelectric effects is expected to increase. For example conversion of waste heat from thermal power stations, plants and automobiles to power using Seebeck effect elements has been proposed (see for example Patent Document 1).

However the current Seebeck effect elements are not sufficiently efficient, and it is necessary to increase the efficiency of thermoelectric conversion in order to put them into practice as a clean energy source.

The figure of merit Z—an indicator of the thermoelectric conversion efficiency—of conventional Seebeck effect elements using a dissimilar metal joint made of two metals having different Seebeck coefficients can be represented by the following formula (1) when S is the Seebeck coefficient, $\sigma$ is the electrical conductivity, and $\kappa$ is the thermal conductivity.

$$Z = S^2 \times (\sigma/\kappa) \quad (1)$$

In addition, the electromotive force V is generated in a direction parallel to the temperature gradient $\nabla T$.

In this case, the Seebeck coefficient S, the electrical conductivity $\sigma$ and the thermal conductivity $\kappa$ are all material parameters, and therefore the figure of merit Z also is a material parameter, and a thermoelectric conversion device having a high figure of merit Z is necessary in order to achieve thermoelectric power generation with high efficiency. Thus, it is necessary to develop a new material in order to increase the figure of merit Z.

Meanwhile, spintronics, which use the spin degree of freedom provided by electrons, as well as charge degree of freedom; that is to say, the spin angular momentum degree of freedom, have been drawing attention as a carrier for next generation electronics technology, which may substitute the charge degree of freedom of electrons used in conventional electronics, for example in semiconductor devices.

In spintronics the charge degree of freedom and spin degree of freedom of electrons are used simultaneously with the goal of finding new functions and properties. Most spintronic functions result when elements are driven by spin current.

Little spin angular momentum is dissipated in the spin current, and thus it is potentially usable for efficient energy transfer. Method for generating and detecting spin current are urgently needed.

Spin pumping has been proposed as one method for generating spin current (see for example Non-Patent Document 1). The present inventors have proposed a method for detecting spin current using the inverse spin-Hall effects.

The present inventors found out that a current flows in a direction perpendicular to the direction of the pure spin current when a pure spin current is injected into a sample, and that there is a difference in potential between the ends of the sample due to the inverse spin-Hall effects, and therefore it is possible to detect a pure spin current by detecting the difference in potential (see for example Non-Patent document 2).

PRIOR ART DOCUMENTS

Patent Documents

Patent Document 1: Japanese Unexamined Patent Publication 2007-165463

Non-Patent Documents

Non-Patent Document 1: Phys. Rev., B19, p. 4382, 1979
Non-Patent Document 2: Applied Physics Letters Vol. 88, p. 182509, 2006

SUMMARY OF THE INVENTION

Problem to Be Solved by the Invention

As is clear from the formula (1), in thermoelectric conversion using Seebeck effects the figure of merit Z is high when a material having a high electrical conductivity $\sigma$ is used. In the case of a metal, however, materials having a high electrical conductivity $\sigma$ also have a high thermal conductivity $\kappa$, and therefore the increase in the figure of merit Z achieved by selecting a high electrical conductivity $\sigma$ is offset by the high thermal conductivity $\kappa$.

The present inventors have also proposed a spin-Seebeck effect element using a junction between a magnetic material, such as NiFe, and a metal having a strong spin-orbit coupling, such as Pt (see Japanese Patent Application 2007-302470). In this spin-Seebeck effect element, spin exchange occurs in the thermal spin current generated in the magnetic material due to the thermal gradient at the interface with Pt, and the current that flows in a direction perpendicular to the direction of the pure spin current generated as a result of the exchange is converted as a voltage across the two ends of the magnetic material.

This is possible because a thermal spin current is generated due to the difference between the up spin current and the down spin current when there is a temperature gradient in the magnetic material, specifically a ferromagnetic material, when an external magnetic field is being applied.

The figure of merit Z in this case can be represented by the following formula (2) when $S_s$ is the Seebeck coefficient of the spin-Seebeck effect element, $\sigma_s$ is the spin conductivity, and $\kappa$ is the thermal conductivity.

$$Z_s = S_s^2 \times (\sigma_s/\kappa) \quad (2)$$

In this case, an electromotive force V is generated in a direction perpendicular to the temperature gradient $\nabla T$ due to the inverse pin-Hall effects. The Seebeck coefficient $S_s$ of the spin-Seebeck effect element is proportional to the length in a direction perpendicular to the temperature gradient $\nabla T$, and therefore is characterized in that the figure of merit $Z_s$ can be modulated by adjusting the size of the sample, unlike with conventional Seebeck effect elements. That is to say, the sample can be formed so as to be long in a direction perpendicular to the temperature gradient $\nabla T$, so that the electromotive force V is proportional to the length.

In this case the spin current is not a physically conserved quantity, and therefore the spin current can be continuously generated by providing a temperature gradient using thermal spin current exchange, and accordingly the thermal electromotive force can also be converted continuously. In this spin-Seebeck effect element, however, a metal having a high thermal conductivity $\kappa$ is used for a thermal spin current generating material, and therefore it is difficult to provide a uniform temperature gradient $\nabla T$ when the sample is made larger in order to increase the electromotive force V. Accordingly, it is difficult to implement thermoelectric conversion devices on an industrial scale using all-metal spin-Seebeck effect elements according to the prior art.

Thus, an object of the present invention is to increase the thermoelectric conversion efficiency by increasing the figure of merit of spin-Seebeck effect elements.

Means for Solving Problem

In order to achieve the above described object, the present invention provides a thermoelectric conversion device having an inverse spin-Hall effect material to at least one end of a thermal spin-wave spin current generating material made of a magnetic dielectric material so that a thermal spin-wave spin current is converted to generate a voltage in the above described inverse spin-Hall effect material when there is a temperature gradient in the above described thermal spin-wave spin current generating material and a magnetic field is applied using a magnetic field applying means.

Thus, a magnetic dielectric material having no conduction electrons is used as a thermal spin current generating material, so that the thermal conductivity κ can be reduced by five orders of magnitude at the most relative to the conventional metal material, which makes it easy to provide a uniform temperature gradient ∇T in a larger sample, and thus a great increase in the figure of merit can be expected. In this case, the thermal spin current is generated in the direction of the temperature gradient as a thermal spin-wave spin current.

In addition, the magnetic dielectric material may be a ferrimagnetic dielectric material, a ferromagnetic dielectric material or an antiferromagnetic dielectric material. In the case where the magnetic dielectric material is a ferrimagnetic dielectric material or a ferromagnetic dielectric material, an antiferromagnetic layer which makes contact with the magnetic dielectric material and fixes the direction of magnetization of the magnetic dielectric material may be provided as a magnetic field applying means.

In addition, the magnetic dielectric material may be any magnetic dielectric material containing Fe or Co, but YIG (yttrium iron garnet), in which little spin angular momentum is dissipated, and which is easily available, and yttrium gallium iron garnet that can be represented by the general formula $Y_3Fe_{5-x}Ga_xO_{12}$ (x<5) are most practical. $Y_3Fe_{5-x}Ga_xO_{12}$ has a large band gap and thus very few conduction electrons, and therefore little spin angular momentum is dissipated due to conduction electrons.

Here, the antiferromagnetic dielectric material is typically nickel oxide or FeO, but most magnetic dielectric materials are antiferromagnetic dielectric materials.

In addition, the magnetic dielectric layer thickness is sufficient if the layer has the properties of a ferromagnetic material or ferrimagnetic material, and thus a thickness of 5 nm or more is sufficient.

It is desirable for the inverse spin-Hall effect material to be one of Pt, Au, Pd, Ag, Bi or an element having an f-orbital. These elements have strong spin-orbit coupling, and therefore the thermal spin-wave spin current and the pure spin current can be exchanged with high efficiency at the interface with the magnetic dielectric material.

When the inverse spin-Hall effect material is too thick, the efficiency is low, due to the backflow current, and therefore it is desirable for the film thickness to be 20 nm or less. However, if it is too thin the resistance is high, causing more Joule heat to be generated in the inverse spin-Hall effect material, and therefore it is desirable for the thickness to be 5 nm or more.

In addition, the inverse spin-Hall effect material may be provided in different plural positions in the longitudinal direction of the thermal spin-wave spin current generating material so as to be usable as a variable voltage battery. In addition, the thermoelectric conversion devices can be connected in series and rolled up so that it is possible to generate high power in a compact structure.

Effects of the Invention

According to the present invention, a magnetic dielectric material having the same properties as a spin-Seebeck effect element where the figure of merit can be increased by adjusting the size of the sample and a low thermal conductivity κ is used to make it easier to provide a uniform temperature gradient ∇T, and thus the figure of merit $Z_s$ can be increased a great deal, and as a result it is possible to implement a thermoelectric conversion device with high efficiency.

BRIEF DESCRIPTION OF THE DRAWINGS

FIGS. 11(a) and (b) are schematic diagrams showing the structure of the thermoelectric conversion device according to the fourth embodiment of the present invention.

BEST MODE FOR CARRYING OUT THE INVENTION

The embodiments of the present invention are described below in reference to FIGS. 1 to 5. According to the present invention, a metal electrode made of an element having strong spin-orbit coupling, such as Pt, Au, Pd, Ag, Bi or an element having an f-orbital; that is to say, an inverse spin-Hall effect material, is provided to at least one end of a thermal spin-wave spin current generating material made of a magnetic dielectric material, and thus a thermal electromotive force V is converted across the two ends of the inverse spin-Hall effect material when there is a temperature gradient in the thermal spin-wave spin current generating material and a magnetic field is applied in the direction of the temperature gradient.

During this exchange between spin-wave spin current and pure spin current, the thermal spin-wave spin current generated due to the temperature gradient in the magnetic dielectric material is exchanged with the spin in the metal electrode, so that a spin current is generated in the metal electrode, and this spin current causes a current which generates the thermal electromotive force V across the two ends of the metal electrode.

Figure 1:
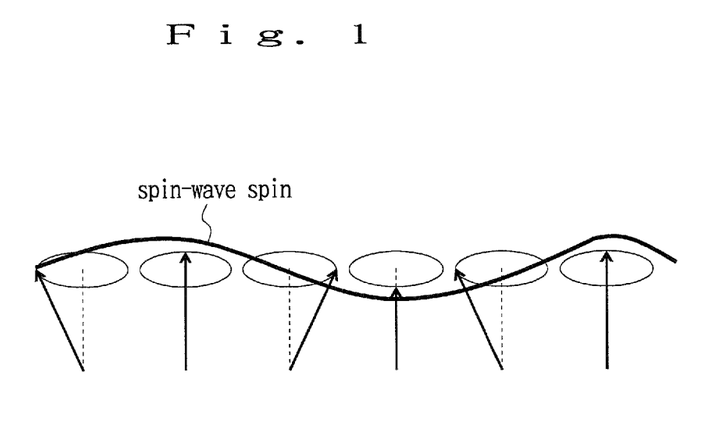
FIG. 1 is a schematic diagram showing a spin-wave spin current.

The spin-wave spin current is as shown in FIG. 1 when a spin is in precession around the equilibrium position and the change in phase is conveyed through the spin system as a wave, and the thermal spin-wave spin current is the change in phase caused by heat.

In addition, the magnetic dielectric layer may be made of any of a ferrimagnetic dielectric material, a ferromagnetic dielectric material or an antiferromagnetic dielectric material. The magnetic dielectric material may be any magnetic dielectric material containing Fe or Co, but YIG (yttrium iron garnet), in which little spin angular momentum is dissipated, and which is easily available, and yttrium gallium iron garnet that can be represented by the general formula $Y_3Fe_{5-x}Ga_xO_{12}$ (x<5) are most practical.

Figure 2:
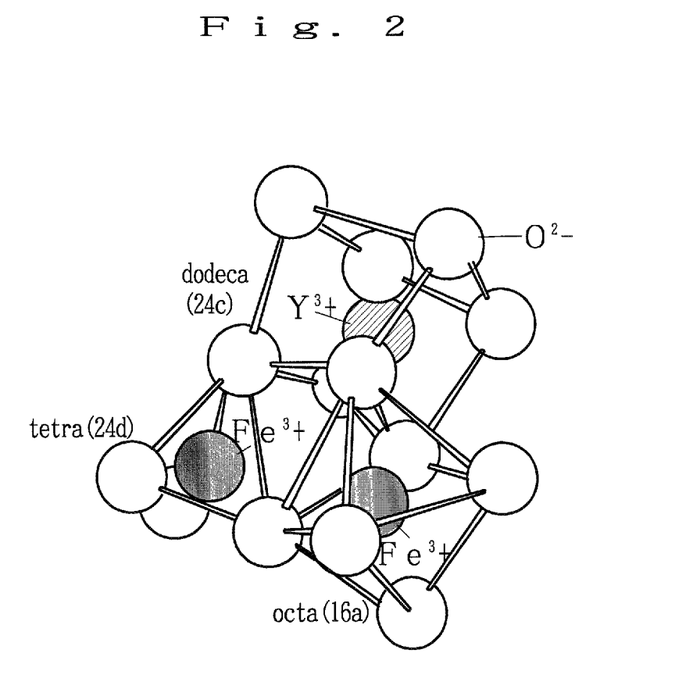
FIG. 2 is a diagram showing the crystal structure of YIG ($Y_3Fe_5O_{12}$)
Figure 3:
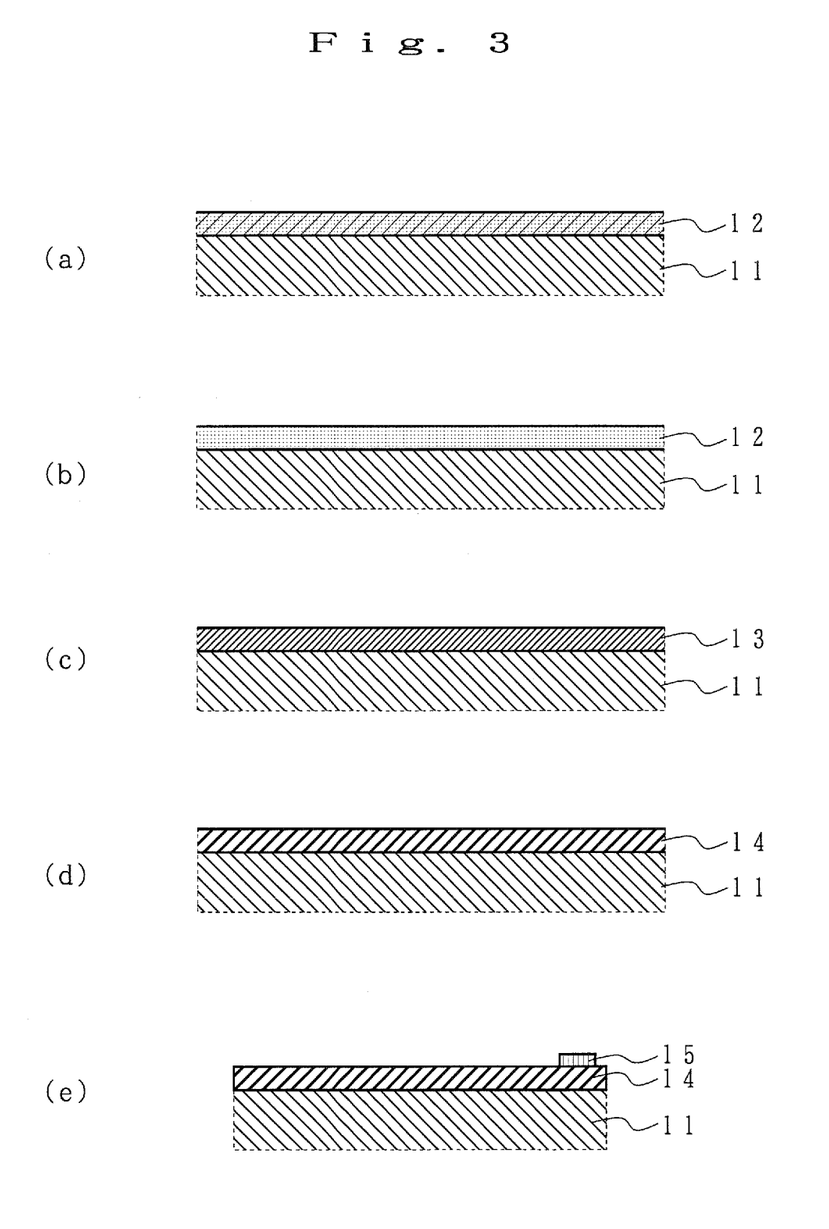
FIGS. 3(a) to 3(e) are diagrams illustrating the manufacturing process for the sample used in one embodiment of the present invention.
Figure 4:
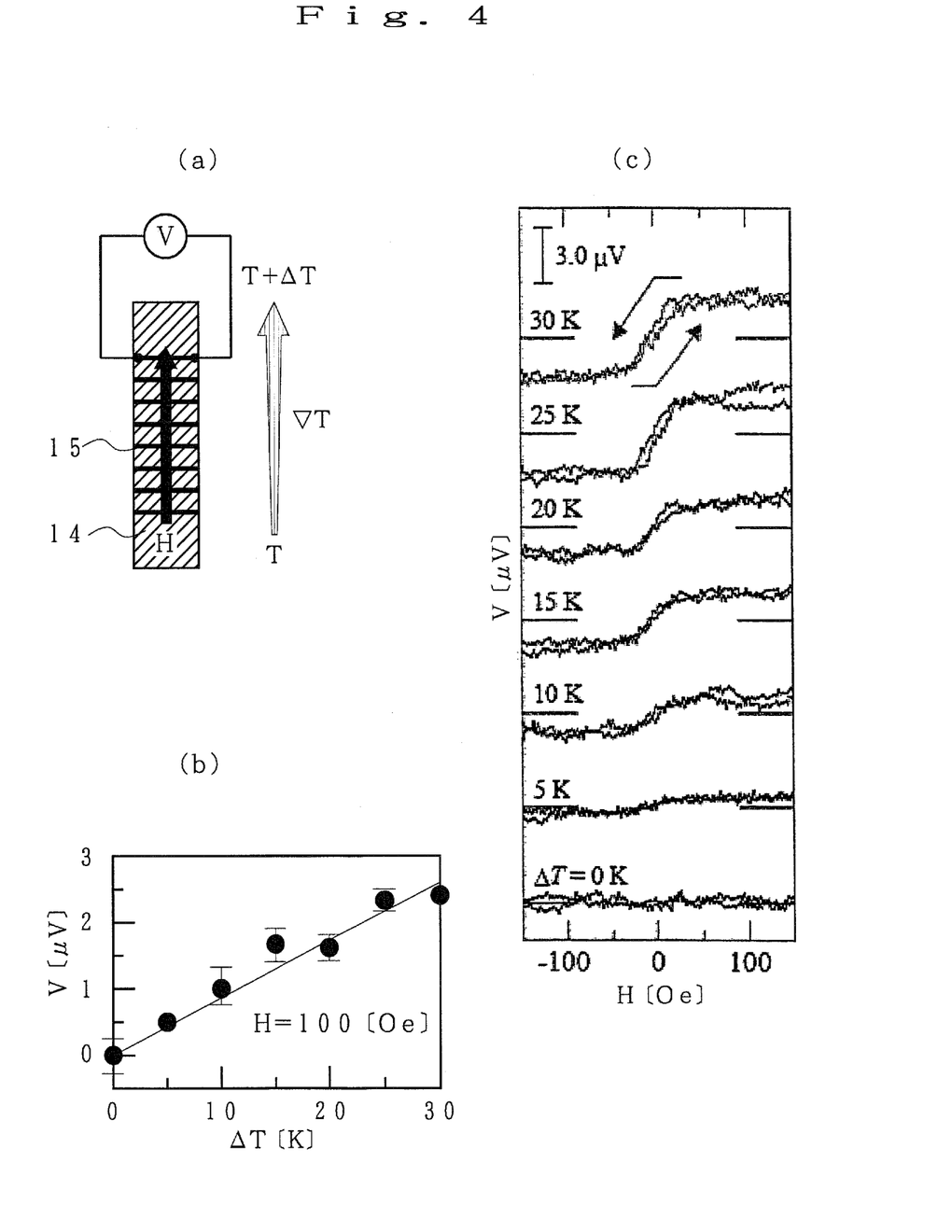
FIGS. 4(a) to 4(c) are diagrams and graphs illustrating the dependency of the electromotive force on the temperature gradient.
Figure 5:
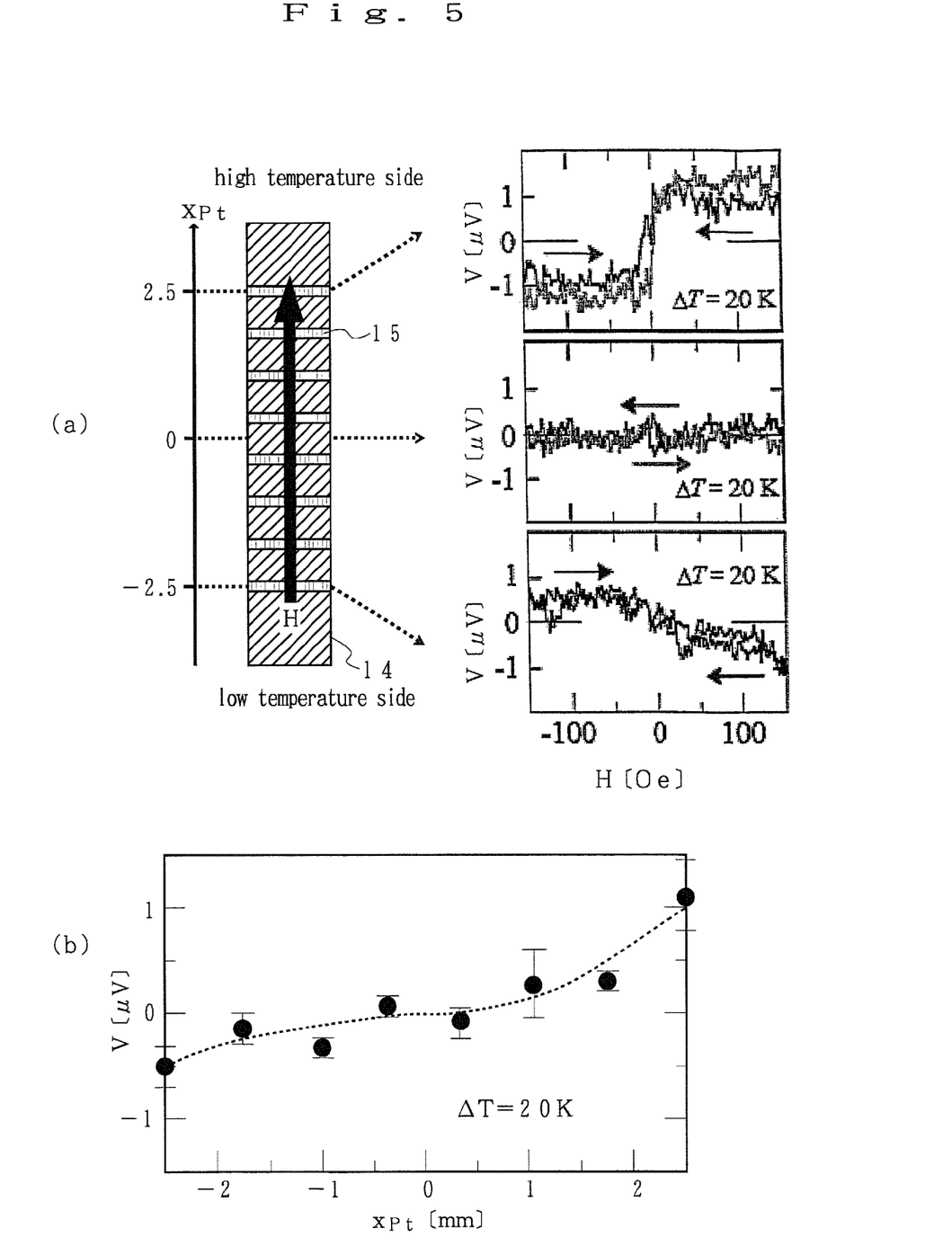
FIGS. 5(a) and 5(b) are diagrams and graphs illustrating the dependency of the electromotive force on the position.

FIG. 2 is a diagram showing the crystal structure of YIG ($Y_3Fe_5O_{12}$). The crystal structure is cubic, and the magnetic structure is ferrimagnetic. In addition, the magnetic ions in the YIG are only $Fe^{3+}$, and there are twenty-four Fe↑ (up spins) and sixteen Fe↓ (down spins) per unit lattice. Accordingly, the unit lattice value of YIG is a magnetic moment for eight Fe. Here, other Fe ions are coupled in an antiferromagnetic manner.

In the case of $Y_3Fe_{5-x}Ga_xO_{12}$, some of the Fe atoms in the $Y_3Fe_5O_{12}$ are randomly replaced with Ga atoms in a structure in which the number of Fe atoms having a magnetic moment becomes smaller as the Ga composition ratio x becomes greater.

In the case where an antiferromagnetic dielectric material is used, it is typically nickel oxide or FeO, but most magnetic dielectric materials are antiferromagnetic dielectric materials. In addition, in the case where the magnetic dielectric layer is formed of a ferromagnetic dielectric material, it is desirable to provide an antiferromagnetic layer in order to fix the direction of magnetization of the magnetic dielectric layer.

In addition, any of a sputtering method, an MOD method (metal-organic decomposition) or a sol-gel method may be used as the method for forming the magnetic dielectric layer. In addition, the magnetic dielectric layer may be of single crystal or polycrystal.

Next, the exchange between thermal spin-wave spin current and pure spin current due to the inverse spin-Hall effects of the magnetic dielectric material on the metal electrode is described. FIGS. 3(a) to 3(e) are diagrams showing the manufacturing process for the sample used in one embodiment of the present invention. A magnetic dielectric film of $Y_3Fe_4GaO_{12}$ is formed in accordance with an MOD method in the sample.

First, as shown in FIG. 3(a), an MOD solution 12 containing $Y_3Fe_4GaO_{12}$ is applied to a GGG ($Gd_3Ga_5O_{12}$) single crystal substrate 11 having a {100} plane as the main surface in accordance with a spin coating method. During spin coating, first the substrate is rotated at 500 rpm for 5 seconds, and after that at 3000 to 4000 rpm for 30 seconds, while the MOD solution 12 is applied uniformly so that the film thickness after sintering is 100 nm. Here, the MOD solution 12 is made by Kojundo Chemical Laboratory Co., Ltd.

Next, as shown in FIG. 3(b), the substrate is dried for 5 minutes on top of a hot plate that is heated to 150° C. so that extra organic solvent in the MOD solution 12 evaporates.

Next, as shown in FIG. 3(c), the substrate is heated in an electrical furnace at 550° C. for 5 minutes so that the applied film is half-sintered to form an oxide layer 13.

Next, as shown in FIG. 3(d), the substrate is heated in an electric furnace at 750° C. for one to two hours so that the oxide layer 13 is sintered and crystallized into a YIG layer 14. Here, the composition of the YIG layer 14 is $Y_3Fe_4GaO_{12}$, which is polycrystal.

Next, as shown in FIG. 3(e), the YIG layer 14 is cut into pieces of 4 mm×10 mm, and after that eight Pt electrodes 15 having a thickness of 10 nm and a width of 0.1 mm are provided on the YIG layer 14 at intervals of 0.6 mm in accordance with a mask sputtering method.

Next, the dependency of the thermal electromotive force V on the temperature gradient ∇T while an external magnetic filed H of 100 Oe is applied in the longitudinal direction of the YIG layer 14 is investigated. FIGS. 4(a) to 4(c) are a diagram and graphs illustrating the dependency of the electromotive force on the temperature gradient. FIG. 4(a) is a schematic diagram showing the structure of the sample, FIG. 4(b) is a graph illustrating the dependency of the electromotive force on the temperature gradient, and FIG. 4(c) is a graph illustrating the dependency of the polarity of the electromotive force on the direction of the magnetic field for each temperature gradient.

As shown in FIG. 4(b), the thermal electromotive force V is approximately proportional to the temperature gradient ∇T; that is to say, the difference in temperature ΔT between the two ends when the difference in temperature ΔT changes from 0 K to 30 K. When the difference in temperature ΔT is 30 K, for example, the difference in potential is approximately 2.5 µV. It can be presumed from the results that a thermal spin-wave spin current is generated in the YIG film 14 made of a magnetic dielectric material due to the temperature gradient ∇T.

This thermal spin-wave spin current is exchanged with a pure spin current at the interface between the YIG film 14 and the Pt electrode 15 so that the pure spin current causes a current in the Pt electrode 15 and a thermal electromotive force V is generated across the two ends of the Pt electrode 15.

The direction of the difference in potential V generated at this time, becomes opposite depending on the direction of the applied fixed magnetic field H, and therefore by measuring the difference in potential V under a certain, fixed magnetic field H and the difference in potential V under a fixed, opposite magnetic field H, the existence of a thermal spin-wave spin current can be verified. Here, in the case where the direction of the difference in potential V does not invert when the magnetic field is reversed, it is not a thermal spin-wave spin current but noise. Thus, in order to prove the results shown in FIG. 4(b) is due to a thermal spin-wave spin current instead of the noise, the dependency of the polarity of the electromotive force on the direction of the magnetic field is investigated.

FIG. 4(c) is a graph illustrating the dependency of the polarity of the electromotive force on the direction of the magnetic field when the difference in temperature ΔT changes from 0 K to 30 K. The polarity of the electromotive force V is inverted when the magnetic field H is reversed. The results prove that the obtained electromotive force V is not the noise but a thermal electromotive force resulting from thermal spin-wave spin current. In this case, for each difference in temperature, the output in the case where the applied magnetic field H changes from −150 Oe to +150 Oe and the output in the case where it changes from +150 Oe to −150 Oe overlap, as shown in the graph, where the arrows indicate the direction of change.

Here, in the case where a Cu electrode is provided as the output electrode, no clear difference in potential can be detected. This is simply because Cu has a small spin-orbit coupling, and therefore the spin current generated due to inverse spin-Hall effects cannot be detected, and does not mean that no thermal spin-wave spin current is generated.

Conversely, the difference in temperature $\Delta T$ K between the two ends of the YIG film 14 can be found from the difference in potential V across the Pt electrode 15 in reference to FIG. 4(b) that shows the dependency of the thermal electromotive force V on the temperature gradient $\nabla T$. The temperature at one end of the thermoelectric conversion device is $(T_0+\Delta T)$ K when the other end is at a constant temperature $T_0$ K in a hot bath and the difference in temperature is $\Delta T$ K, and thus the thermoelectric conversion device can be used to measure the temperature in a predetermined portion; that is to say, as a thermocouple.

Next, the dependency of the thermal electromotive force V on the position is investigated. FIGS. 5(a) and 5(b) are a diagram and graphs for illustrating the dependency of the electromotive force on the position. FIG. 5(a) is a schematic diagram showing the structure of the sample and graphs illustrating the dependency of the polarity of the electromotive force on the direction of the magnetic field in each position. Here, the difference in temperature between the two ends of the sample is fixed at 20 K. In this case, for each difference in temperature, the output in the case where the applied magnetic field H changes from −150 Oe to +150 Oe and the output in the case where it changes from +150 Oe to −150 Oe overlap, as shown in the graph, where the arrows indicate the direction of change. FIG. 5(b) is a graph showing the dependency of the electromotive force on the position. The electromotive force V in the case where the external magnetic field is 100 Oe and the difference in temperature between the two ends of the sample is fixed at 20 K is plotted against the position in which the Pt electrode 15 is attached. The dotted line is the function.

It is clear from FIGS. 5(a) and 5(b) that polarity of the inverse spin-Hall electromotive force generated across the Pt electrode is reversed between the case where the Pt electrode 15 is attached to the YIG film 14 on the high temperature side and the case where it is attached to the YIG film 14 on the low temperature side. In addition, the results show that the electromotive force can be modulated by changing the position in which the Pt electrode 15 is attached.

First Embodiment

Figure 6:
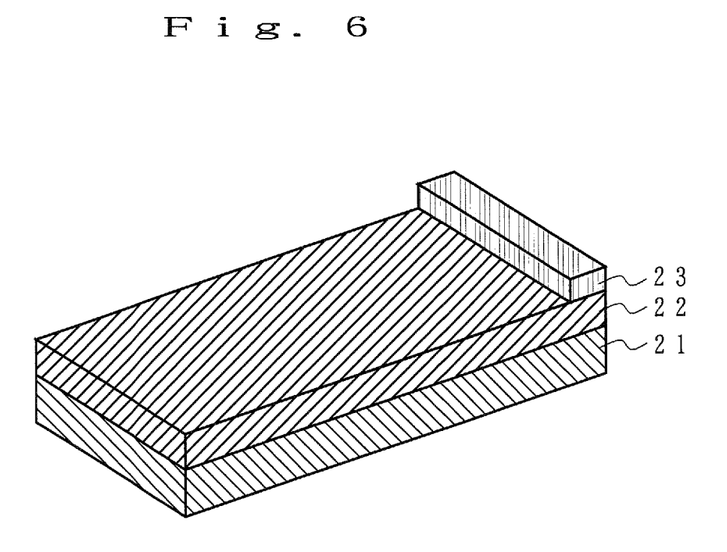
FIG. 6 is a schematic perspective diagram showing the thermoelectric conversion device according to the first embodiment of the present invention.

Next, the thermoelectric conversion device according to the first embodiment of the present invention is described in reference to FIG. 6. FIG. 6 is a schematic perspective diagram showing the thermoelectric conversion device according to the first embodiment of the present invention, where a YIG layer 22 containing $Y_3Fe_4GaO_{12}$ having a thickness of 100 nm is formed on a GGG single crystal substrate 21 in accordance with a sputtering method, and a Pt film having a thickness of 10 nm and a width of 0.6 mm is deposited on top in accordance with a mask sputtering method so that a Pt electrode 23 is formed, and thus the thermoelectric conversion device according to the first embodiment of the present invention is provided.

Figure 7:
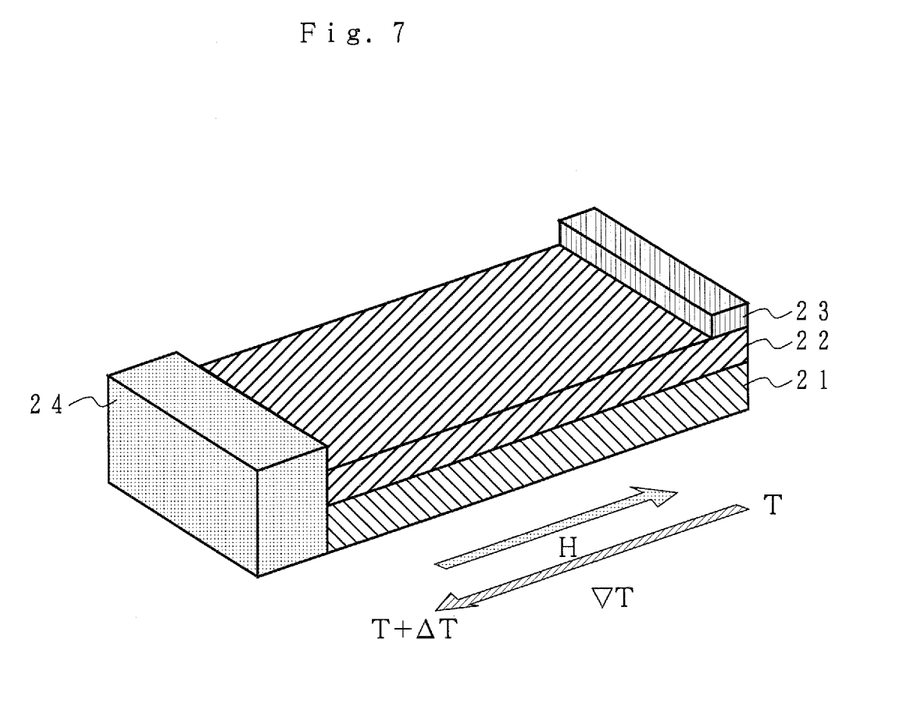
FIG. 7 is a diagram showing how the thermoelectric conversion device according to the first embodiment of the present invention is used.

FIG. 7 is a diagram showing how the thermoelectric conversion device according to the first embodiment of the present invention is used. As shown in FIG. 7, when an external magnetic field H is applied in a direction perpendicular to the longitudinal direction of the Pt electrode 23, and at the same time the end of the YIG layer 22 on the side where the Pt electrode 23 is not provided is inserted into a heat source 24 or otherwise made to make contact with the heat source 24, there is a temperature gradient $\nabla T$ in the YIG layer 22 along the external magnetic field H. This temperature gradient $\nabla T$ causes an electromotive force V across the two ends of the Pt electrode 23.

In this case, the thermal conductivity $\kappa$ of the YIG layer 22 is 7 $W \cdot m^{-1} \cdot K^{-1}$, which is smaller than the 90 $W \cdot m^{-1} \cdot K^{-1}$ of NiFe, and therefore the figure of merit $Z_s$ of the spin-Seebeck effect element is much higher. In addition, the figure of merit $Z_s$ can be further increased by using a magnetic dielectric material having a lower thermal conductivity than YIG. Here, in the case where the thermoelectric conversion device is used as a thermocouple, it is desirable for the low temperature side, where the Pt electrode 23 is provided, to make contact with a constant temperature medium, in order to increase the precision of measurement.

Second Embodiment

Figure 8:
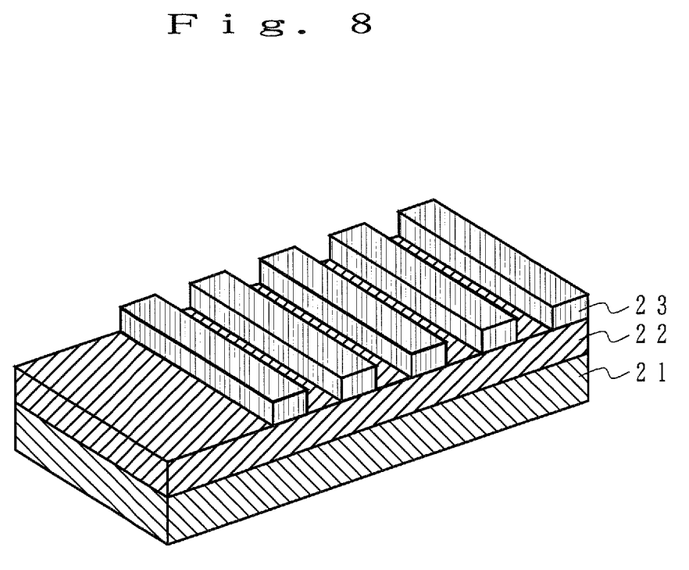
FIG. 8 is a schematic perspective diagram showing the thermoelectric conversion device according to the second embodiment of the present invention.

Next, the thermoelectric conversion device according to the second embodiment of the present invention is described in reference to FIG. 8. FIG. 8 is a schematic perspective diagram showing the thermoelectric conversion device according to the second embodiment of the present invention, where a YIG layer 22 containing $Y_3Fe_4GaO_{12}$ having a thickness of 100 nm is formed on a GGG single crystal substrate 21 in accordance with a sputtering method, and five Pt films having a thickness of 10 nm and a width of 0.1 mm are deposited on top with intervals of 0.6 mm in accordance with a mask sputtering method so that five Pt electrodes 23 are formed, and thus the thermoelectric conversion device according to the second embodiment of the present invention is provided. FIG. 8 is a schematic diagram, and does not show the actual dimensions of the Pt electrodes 23.

Figure 9:
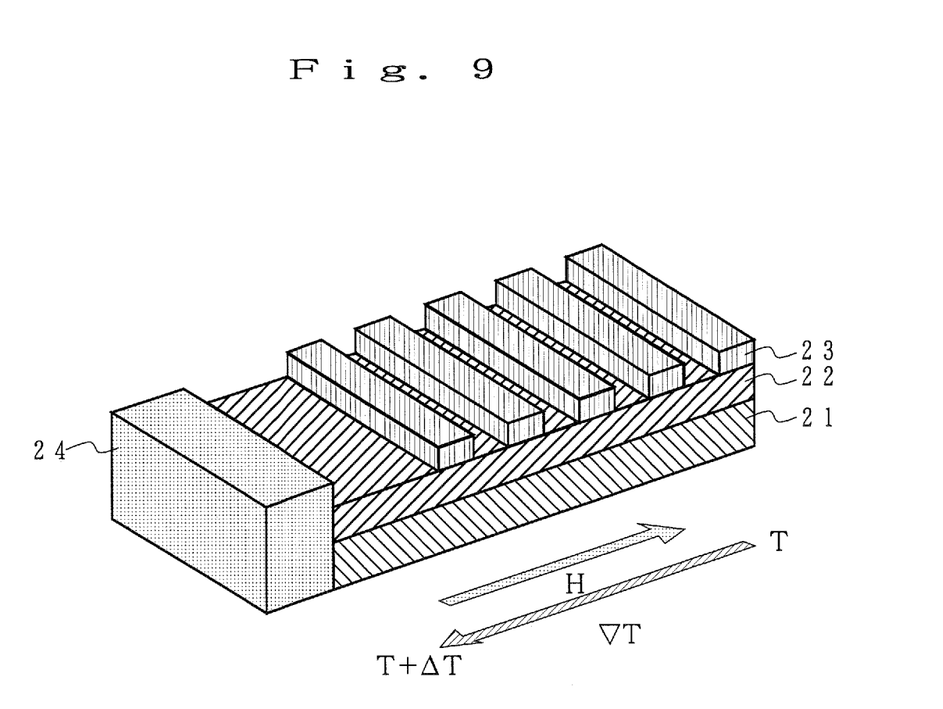
FIG. 9 is a diagram showing how the thermoelectric conversion device according to the second embodiment of the present invention is used.

FIG. 9 is a diagram showing how the thermoelectric conversion device according to the second embodiment of the present invention is used. As shown in FIG. 9, an external magnetic field H is applied in a direction perpendicular to the longitudinal direction of the Pt electrodes 23, and at the same time one end of the YIG layer 22 is inserted into a heat source 24 or otherwise made to make contact with the heat source 24, so that there is a temperature gradient $\nabla T$ in the YIG layer 22 along the external magnetic field H. This temperature gradient $\nabla T$ causes an electromotive force V that is proportional to the temperature gradient $\nabla T$ across the two ends of the Pt electrodes 23.

As is clear from the results shown in FIG. 5(b), the electromotive force V that is proportional to the temperature gradient $\nabla T$ changes depending on the distance from the heat source 24, and therefore by arbitrarily selecting the position of the Pt electrode 23, the thermoelectric conversion device can be used as a variable voltage battery.

Third Embodiment

Figure 10:
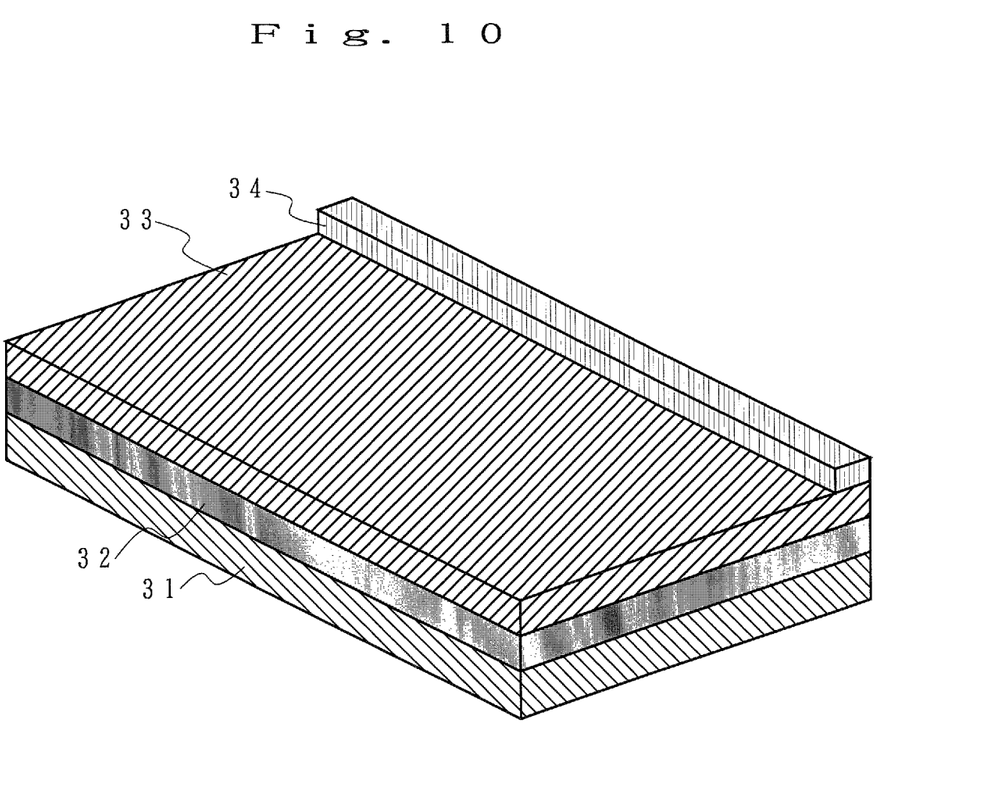
FIG. 10 is a schematic perspective diagram showing the thermoelectric conversion device according to the third embodiment of the present invention.

Next, the thermoelectric conversion device according to the third embodiment of the present invention is described in reference to FIG. 10. FIG. 10 is a schematic perspective diagram showing the thermoelectric conversion device according to the third embodiment of the present invention, where an InMn antiferromagnetic layer 32 having a thickness of 50 nm is deposited on top of a GGG single crystal substrate 31 in accordance with a sputtering method. A YIG layer 33 having a $Y_3Fe_4Ga_{12}$ composition and a thickness of 100 nm is formed on top of this. Furthermore, a Pt film having a thickness of 10 nm and a width of 0.1 mm is deposited on top in accordance with a mask sputtering method as a Pt electrode 34, and thus the thermoelectric conversion device according to the third embodiment of the present invention is provided. Here, when the InMn antiferromagnetic layer 32 is deposited, a magnetic field is applied in a direction perpendicular to the longitudinal direction of the Pt electrode 34.

In this case, the magnetization of the grains in the polycrystal that forms the YIG layer 33 is the same as the Mn antiferromagnetic layer 32, and is fixed because of the latter, and therefore a thermal spin-wave spin current can be generated in the direction in which the magnetization is fixed without an external magnetic field for orienting the direction of magnetization.

The electromotive force generated in the third embodiment of the present invention is proportional to the length of the Pt electrode 15, and therefore the thermoelectromotive force is higher when the YIG layer 33 is longer in a direction perpendicular to the direction of the thermal spin-wave spin current. That is to say, the figure of merit $Z_s$ can be modulated by adjusting the size of the sample, and theoretically it should be possible to form a thermoelectric element having an infinite figure of merit.

Fourth Embodiment

Figure 11:
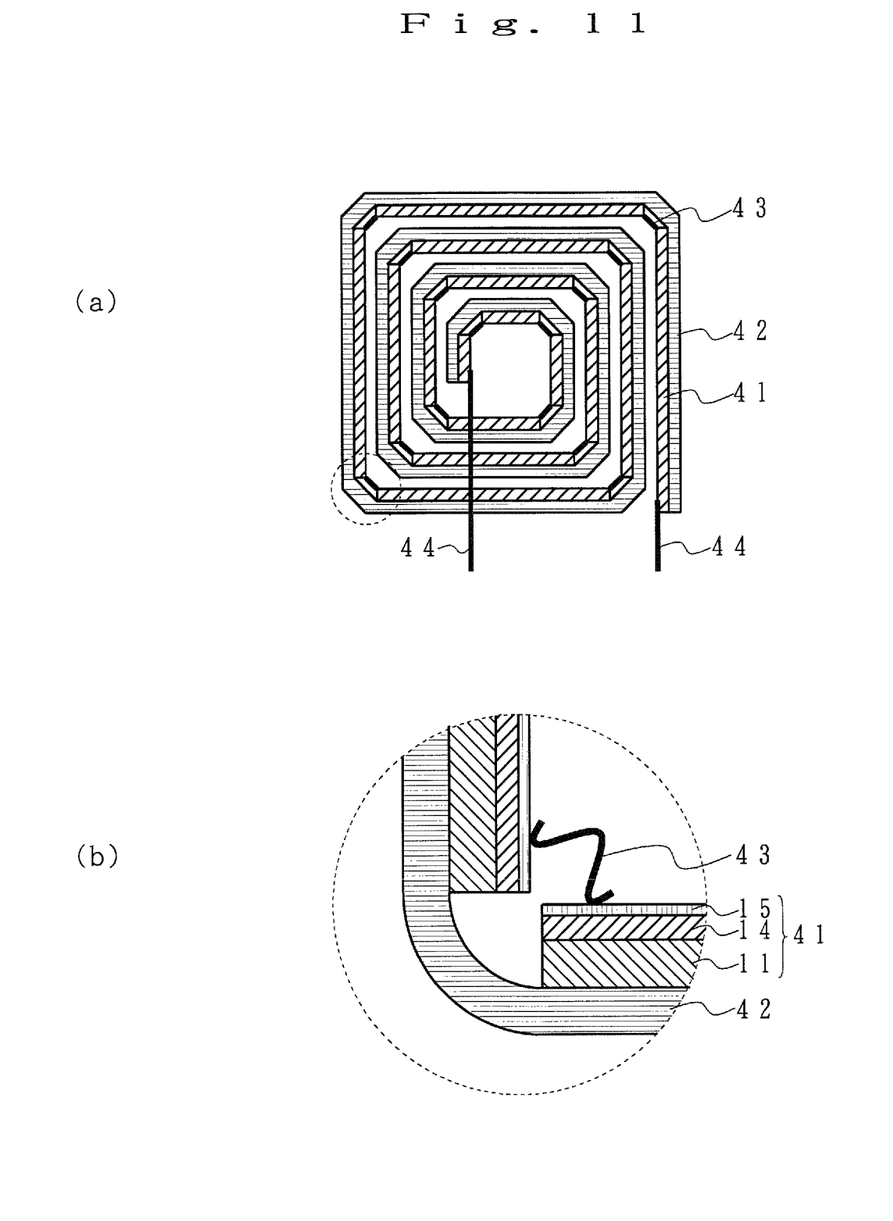

Next, the thermoelectric conversion device according to the fourth embodiment of the present invention is described in reference to FIGS. 11(a) and 11(b). Fig (a) is a schematic cross sectional diagram showing the thermoelectric conversion device according to the fourth embodiment of the present invention in the direction of the layer thickness, and FIG. 11(b) is a cross sectional diagram showing an enlargement thereof. The thermoelectric conversion device according to the fourth embodiment of the present invention is formed of a number of thermoelectric conversion devices having the same structure as that according to the first embodiment, which are connected in series so that an output voltage is accumulated, and rolled up.

As shown in FIG. 11(b), the individual thermoelectric conversion devices are fabricated in accordance with an MOD method, and the YIG film 14 having a $Y_3Fe_4GaO_{12}$ composition is formed through the same process as in the above embodiment: applying an MOD solution having a $Y_3Fe_4GaO_{12}$ composition on a GGG single crystal substrate 11 having a {100} plane as the main surface in accordance with a spin coating method, half sintered and then sintered.

Next, the YIG layer 40 is cut into pieces of a predetermined size, and a Pt electrode 15 having a thickness of 10 nm and a width of 0.1 mm is provided on each piece of YIG layer 14 in accordance with a mask sputtering method, and thus thermoelectric conversion devices 41 are formed. Here, the individual pieces are cut gradually longer, so that rolling up is easier.

Next, the thermoelectric conversion devices 41 are aligned on a heat resistant flexible substrate 42 made of a heat resistant glass fiber cloth in the order of length at predetermined, microscopic intervals and joined through metallization, and after that adjacent Pt electrodes 15 are connected through wire bonding using Au wires 43. Here, output terminals 44 are connected to the Pt electrode of the innermost and outermost thermoelectric conversion devices.

Next, the substrate is rolled up starting from the shorter thermoelectric conversion device, and thus the thermoelectric conversion device according to the fourth embodiment of the present invention is provided. Though it is rolled up into a quadrilateral form in the figure, it may be rolled up into a triangular form, a pentagonal form or a hexagonal form.

In the fourth embodiment of the present invention, a number of thermoelectric conversion devices 41 are connected in series through wire bonding, and therefore the entire element is long in a direction perpendicular to the direction of the thermal spin-wave spin current, which makes it possible to generate high power with a compact structure.

A compact structure makes it possible to generate high power effectively even when the heat source or heat bath is small. Furthermore, the output voltage is approximately proportional to the number of turns the element is rolled up, and therefore it is possible to increase the output voltage by increasing the number of turns the element is rolled up.

Though modes and embodiments of the present invention are described above, the present invention is not limited to the structures and conditions in these modes and embodiments, and various modifications are possible.

For example, though Pt is used for the inverse spin-Hall effect material in the above described embodiments, the material is not limited to Pt, and Pd, of which the spin-orbit coupling is as strong as Pt, Au, Ag, Bi, or any other element having an f-orbital may be used instead of Pt.

In addition, though YIG is used as the magnetic dielectric material in the above described modes and embodiments, the material is not limited to YIG, and a ferromagnetic dielectric material or an antiferromagnetic dielectric material, such as FeO, may be used.

In addition, an external magnetic field may be used in the third embodiment instead of an antiferromagnetic layer, such as of InMn, in order to apply a magnetic field to the YIG layer for magnetization. Conversely, an antiferromagnetic layer, such as of InMn or PdPtMn, may be used in the first and second embodiments instead of an external magnetic field.

In addition, though in the fourth embodiment a heat resistant substrate is used as a flexible substrate, a resin film, such as of PET, may be used when the heat source is at a relatively low temperature, for example 200° C. or less, and in this case, the thermoelectric conversion devices may be fixed to the resin substrate using an adhesive.

INDUSTRIAL APPLICABILITY

Though the present invention is typically applied to thermoelectric conversion devices, the application is not limited to this, and the invention may be used as a thermocouple for measuring temperature.

The invention claimed is:
1. A thermoelectric conversion device comprising:
a thermal spin-wave spin current generating material made of a magnetic dielectric material extending in a direction;
an inverse spin-Hall effect material provided at least one end in said direction of said thermal spin-wave spin current generating material;
a heat source to give temperature gradient in said direction in said thermal spin-wave spin current generating material; and
a magnetic field generator to generate magnetic field in said direction in said thermal spin-wave spin current generating material,
wherein a thermal spin-wave spin current is converted to generate a voltage in said inverse spin-Hall effect material when there is a temperature gradient in said thermal spin-wave spin current generating material, and a magnetic field is applied using said magnetic field generator.
2. The thermoelectric conversion device according to claim 1, wherein said magnetic dielectric material is made of any of a ferrimagnetic dielectric material, a ferromagnetic dielectric material or an antiferromagnetic dielectric material.

3. The thermoelectric conversion device according to claim 1, wherein said magnetic dielectric material is made of a ferrimagnetic dielectric material or a ferromagnetic dielectric material, and said magnetic field applying means is an antiferromagnetic layer which makes contact with said magnetic dielectric material and fixes the direction of magnetization of the magnetic dielectric material.

4. The thermoelectric conversion device according to claim 1, wherein said magnetic dielectric material is made of $Y_3Fe_{5-x}Ga_xO_{12}$ (x<5).

5. The thermoelectric conversion device according to claim 1, wherein said inverse spin-Hall effect material is made of any of Pt, Au, Pd, Ag, Bi or an element having an f-orbital.

6. The thermoelectric conversion device according to claim 5, wherein said magnetic dielectric material has a film thickness of 5 nm or more and said inverse spin-Hall effect material has a film thickness of 5 nm to 20 nm.

7. The thermoelectric conversion device according to claim 1, wherein said inverse spin-Hall effect material is provided in different plural positions in the longitudinal direction of said thermal spin-wave spin current generating material.

8. A thermoelectric conversion device comprising a plurality of thermoelectric conversion sub-elements, one or more thermoelectric conversion sub-elements comprising:

a thermal spin-wave spin current generating material made of a magnetic dielectric material extending in a direction;

an inverse spin-Hall effect material provided at least one end in said direction of said thermal spin-wave spin current generating material;

a heat source to give temperature gradient in said direction in said thermal spin-wave spin current generating material; and a magnetic field generator to generate magnetic field in said direction in said thermal spin-wave spin current generating material, wherein a thermal spin-wave spin current is converted to generate a voltage in said inverse spin-Hall effect material when there is a temperature gradient in said thermal spin-wave spin current generating material, and a magnetic field is applied using said magnetic field generator, and said thermoelectric conversion sub-elements are secured to a flexible substrate that is rolled up starting from the shortest inverse spin-Hall effect material so that adjacent inverse spin-Hall effect materials are connected in series.

* * * * *